United States Patent
O'Sullivan et al.

(10) Patent No.: US 7,420,433 B2
(45) Date of Patent: Sep. 2, 2008

(54) PHASE LOCK LOOP RF MODULATOR SYSTEM

(75) Inventors: Cormac E. O'Sullivan, Cork (IE); Colin Lyden, County Cork (IE); Hyman N. Shanan, Cork (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 11/494,345

(22) Filed: Jul. 27, 2006

(65) Prior Publication Data

US 2007/0109067 A1 May 17, 2007

Related U.S. Application Data

(60) Provisional application No. 60/737,600, filed on Nov. 17, 2005.

(51) Int. Cl.
*H03C 3/06* (2006.01)

(52) U.S. Cl. .......................................... 332/128; 331/23
(58) Field of Classification Search ................. 332/128, 332/127, 23; 331/23
See application file for complete search history.

(56) References Cited

U.S. PATENT DOCUMENTS

| | | | |
|---|---|---|---|
| 4,573,026 A | | 2/1986 | Curtis |
| 4,707,670 A * | 11/1987 | Dakin ........................ 332/127 |
| 6,008,703 A * | 12/1999 | Perrott et al. ............... 332/100 |
| 6,160,861 A | | 12/2000 | McCollough |
| 6,670,861 B1 | | 12/2003 | Balboni |
| 6,724,265 B2 | | 4/2004 | Humphreys |
| 6,806,780 B2 | | 10/2004 | Fontaine |
| 2003/0043950 A1 * | 3/2003 | Hansen et al. ............... 375/376 |
| 2003/0153286 A1 * | 8/2003 | Bisanti et al. ............... 455/126 |
| 2003/0169827 A1 | | 9/2003 | Shi |
| 2003/0203724 A1 | | 10/2003 | Luo et al. |
| 2004/0066424 A1 | | 4/2004 | Staszewski |
| 2004/0087285 A1 | | 5/2004 | Black et al. |
| 2005/0041755 A1 * | 2/2005 | Hammes ..................... 375/295 |
| 2005/0285688 A1 * | 12/2005 | Hirano et al. ................. 331/16 |

OTHER PUBLICATIONS

Michael H. Perrott et al., "A 27-mW CMOS Fractional-N Synthesizer Using Digital Compensation for 2.5Mb/s GFSK Modulation", JSSC, Dec. 1997.

Daniel McMahill et al., "Automatic Calibration of Modulated Frequency Synthesizers", TransCAS II: Analog and Digital Signal Processing, May 2002.

(Continued)

*Primary Examiner*—Joseph Chang
(74) *Attorney, Agent, or Firm*—Iandiorio Teska & Coleman

(57) ABSTRACT

A phase lock loop RF modulator system including a phase lock loop circuit having a phase detector circuit responsive to an input reference signal and a feedback signal, an oscillator circuit responsive to the phase detector circuit for providing an output signal, a forward path from the phase detector circuit to the oscillator circuit, and a feedback path from the oscillator circuit to the phase detector circuit. The system also includes a first modulation port coupled to the feedback path, a second modulation port coupled to the forward path, and a gain mismatch detection circuit responsive to modulation data and a phase error between the reference signal and the feedback signal for providing an indicator output signal that represents the gain mismatch between the first modulation port and the second modulation port.

63 Claims, 9 Drawing Sheets

OTHER PUBLICATIONS

Daniel McMahill et al., "A 2.5Mb/s GFSK 5.0-Mb/s 4-FSK Automatically Calibrated Sigma Delta Frequency Synthesizer", JSSC, Jan. 2002.

Robert B. Staszewski et al., "Just-In-Time Gain Estimation of an RF Digitally-Controlled Oscillator for Digital Direct Frequency Modulation", TransCAS II, Nov. 2003.

See Taur Lee, Paul Fontaine et al., "A Quad-Band GSM-GPRS Transmitter With Digital Auto-Calibration", JSSC, Dec. 2004.

Analog Devices, Inc., "A Single Chip RF-CMOS Bluetooth Radio Transceiver", presented at the GTC2002 Conference, held Apr. 10, 2002.

Taur Lee et al., *A Quad-Band GSM-GPRS Transmitter with Digital Auto-Calibration*, 39(12) IEEE J. Solid-State Circuits 2200 (Dec. 2004).

* cited by examiner

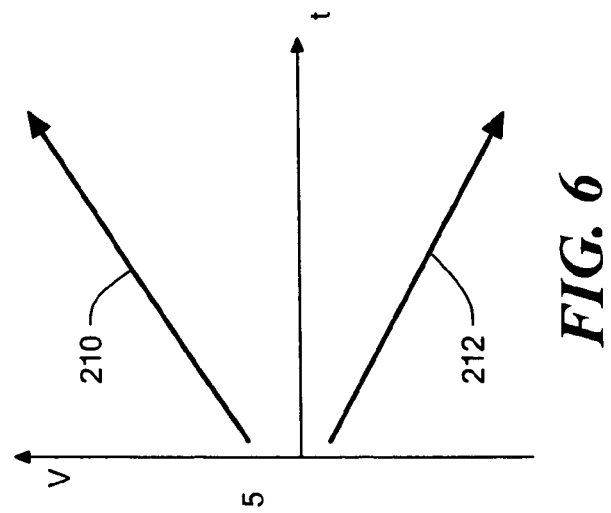
FIG. 6
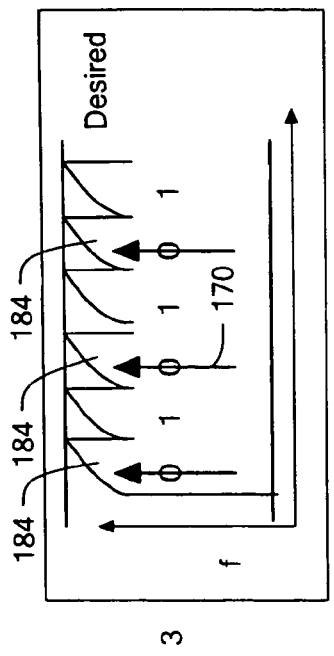
FIG. 5A
FIG. 5B
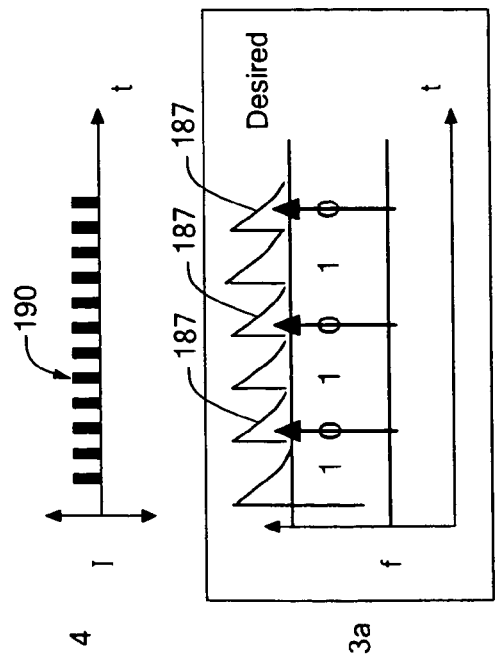
FIG. 5C
FIG. 5D

PHASE LOCK LOOP RF MODULATOR SYSTEM

RELATED APPLICATIONS

This application claims benefit of U.S. Provisional Application Ser. No. 60/737,600 filed Nov. 17, 2005, incorporated by reference herein.

FIELD OF THE INVENTION

This invention relates generally to phase lock loop (PLL) RF modulator systems and more particularly to an improved two port PLL RF modulator system with gain matching between the modulation ports.

BACKGROUND OF THE INVENTION

Conventional IQ modulator systems used to generate phase/frequency modulated data typically include a Cartesian up converter that employs a local oscillator in the form of a PLL. These systems typically require at least an RF quadrature generator, two RF mixers and two digital-to-analog converters. These systems are fairly complicated, expensive, require a lot of power, and utilize significant die area.

A more efficient way to generate modulation signals utilizes the fine phase/frequency control available with a fractional-N PLL. However, when a conventional fractional-N PLL is utilized at higher data rates, the noise, e.g., quantization noise, introduced by the increased bandwidth of the fractional-N PLL degrades modulation quality. The loop filter of the fractional-N PLL also has the conflicting requirement that it needs to act as a high bandwidth filter to accommodate high data rates and as a low bandwidth filter to remove quantization noise.

One conventional technique that attempts to increase modulation bandwidth beyond the loop bandwidth of the PLL while reducing unwanted noise includes two-port modulation. A typical conventional two port PLL RF modulator system includes a first modulation port introduced at the N-divider circuit that is responsive to modulation data and has a low pass bandwidth characteristic. A second modulation port, also responsive to modulation data, is typically introduced between the loop filter and the voltage controlled oscillator (VCO). The second modulation port has a high pass characteristic that allows the PLL to accommodate higher data rates. The system attempts to match the gain of the two modulation ports in such a way that the data is not bandwidth limited.

Typically, the gain associated with the first modulation port is relatively predictable due to its digital nature. However, the gain associated with second modulation port is often not as expected due to manufacturing processes, temperature variations, supply voltage variations, and the like, of the various components of the PLL. Hence, the gain of the second modulation port will typically not match the gain of the first modulation port, causing the PLL loop gain to vary significantly resulting in system malfunctioning. Therefore, accurate calibration of the PLL loop gain and/or the gain of the second modulation port is needed.

Conventional PLL RF modulator systems and methods that attempt to overcome the problem associated with gain matching of the modulation ports of a two-port PLL RF modulator often utilize a measure and adjust approach. The PLL is programmed to one frequency and the input control voltage of the VCO is measured to provide an estimate of the loop gain of the PLL. The PLL is then programmed to a second frequency and the input control voltage is measured again. The measured voltage difference is then used typically in a look-up table to set the correct modulation gain of the second modulation port. However, these conventional systems provide no feedback and cannot determine if the gain adjustment is compensated as required. The systems require at least a one time calibration that requires taking the system offline which is cumbersome and expensive. Once set, the system can go out of adjustment and/or change due to temperature variations and the like. Yet another conventional PLL RF modulator that utilizes the benefits of feedback samples the VCO output in quadrature. The design requires an additional loop placed around the PLL which compares the output RF phase with an estimate of the desired phase due to the data and the channel to correct the loop gain variation. The drawback of this design is the need for RF phase sampling and quadrature, which is expensive and complicated.

Once the loop gain of a PLL RF modulator system is calibrated, a technique known as pre-emphasis can be utilized to increase the modulation bandwidth. Pre-emphasis employs a digital filter responsive to the modulation data which is constructed with the inverse transfer function of the low pass PLL transfer function. The output of the digital filter is typically input to the first modulation port. One advantage of the digital filter is that it generates less noise. Other advantages of a digital filter are known by those skilled in the art. However, the digital filter must match the PLL response.

SUMMARY OF THE INVENTION

It is therefore an object of this invention to provide an improved phase lock loop RF modulator system.

It is a further object of this invention to provide such an RF modulator system which measures the gain of the two modulation ports of the PLL and then modifies the gain of one of the modulation ports in feedback such that the gain of the two modulation ports is matched.

It is a further object of this invention to provide such an RF modulator system which is less complex.

It is a further object of this invention to provide such an RF modulator system which is less expensive.

It is a further object of this invention to provide such an RF modulator system which utilizes less power.

It is a further object of this invention to provide such an RF modulator system which utilizes less die space.

It is a further object of this invention to provide such an RF modulator system which eliminates the need for offline calibration.

It is a further object of this invention to provide such an RF modulator system which provides gain matching between the modulation ports with variations in temperature.

It is a further object of this invention to provide such an RF modulator system which provides gain matching between the modulation ports with manufacturing imperfections.

It is a further object of this invention to provide such an RF modulator system which provides gain matching between the modulation ports with variations in supply voltages.

It is a further object of this invention to provide such an RF modulator system which provides both high bandwidth data characteristics and low bandwidth noise characteristics.

It is a further object of this invention to provide such an RF modulator system which is able to measure and reduce the gain mismatch between the modulation ports and employ pre-emphasis.

The subject invention results from the realization that in the event of gain mismatch in a two-port modulator system, the phase error is correlated with the input data. The magnitude of the gain error can be determined by correlating (mixing) the phase error and data. The correlation can be achieved simply and inexpensively. In one preferred embodiment, an improved phase lock RF modulator system is effected by the combination of a gain mismatch detection circuit responsive to modulation data and a phase error between a reference signal and a feedback signal to provide an indicator output signal that represents the gain mismatch between first and second modulation ports and a tuning circuit responsive to the indicator output signal that adjusts a parameter of one of the first or second modulation ports such that the gain for the first modulation port matches the gain of the second modulation port. A phase detector circuit is responsive to an input reference signal and a feedback signal. An oscillator circuit is responsive to the phase detector circuit to provide an output signal. There is a feedback path from the oscillator circuit to the phase detector circuit, a forward path from the phase detector circuit to the oscillator circuit, a first modulation port coupled to the feedback path, and a second modulation port coupled to the forward path.

The result is a system able to measure the gain of a first modulation port and a second modulation port of the system and then modify the gain of one of those ports in feedback to reduce the gain mismatch between the first and second modulation ports and that has the characteristics of both a high bandwidth filter to accommodate high data rates and a low bandwidth filter to remove unwanted noise.

The subject invention, however, in other embodiments, need not achieve all these objectives and the claims hereof should not be limited to structures or methods capable of achieving these objectives.

This invention features a phase lock loop RF modulator system including a phase lock loop circuit. The phase lock loop circuit includes a phase detector circuit responsive to an input reference signal and a feedback signal, an oscillator circuit responsive to the phase detector circuit for providing an output signal, a forward path from the phase detector circuit to the oscillator circuit, and a feedback path from the oscillator circuit to the phase detector circuit. The system also includes a first modulation port coupled to the feedback path, a second modulation port coupled to the forward path and a gain mismatch detection circuit responsive to modulation data and a phase error between the reference signal and the feedback signal for providing an indicator output signal that represents the gain mismatch between the first modulation port and the second modulation port.

In a preferred embodiment, the forward path may include a loop filter circuit responsive to the output of the phase detector circuit. The loop filter may further include a charge pump circuit. The feedback path may include a divider circuit. The gain mismatch detection circuit may include at least one multiplier circuit for correlating the phase error between the reference signal and the feedback signal with the modulation data to provide the indicator output signal. The gain mismatch detection circuit may also include a plurality of multiplier circuits for correlating the phase error between the reference signal and the feedback signal with the modulation data to provide the indicator output signal. The gain mismatch detection circuit may include a low pass filter. The low pass filter may include an integrator circuit. The low pass filter may also include a charge pump circuit. The gain mismatch detection circuit may be responsive to the phase detector circuit. The phase detector circuit may include a phase frequency detector circuit. The gain mismatch detection circuit may be responsive to the phase frequency detector circuit. The gain mismatch detection circuit may include a phase detector circuit. The phase detector circuit may include a phase frequency detector circuit. The phase lock loop circuit may comprise a fractional-N phase lock loop circuit. The fractional-N phase lock loop circuit may include a $\Sigma\Delta$ modulator circuit. The system may further include a tuning circuit responsive to the indicator output signal. The tuning circuit may modify at least one parameter associated with the second modulation port. The gain mismatch detector circuit and the tuning circuit may be coupled in feedback for measuring the gain mismatch and modifying the at least one parameter such that the gain mismatch is reduced. The gain mismatch may be reduced to a predetermined tolerance level and/or for a predetermined amount of time. The system may further include a second port modulation circuit coupled to the second modulation port responsive to the modulation data for converting the modulation data to analog signals. The tuning circuit may modify at least one parameter of the second port modulation circuit. The at least one parameter may include the loop gain of the second port modulation circuit. The gain mismatch detection circuit and the tuning circuit may be coupled in feedback for measuring the gain mismatch and modifying the at least one parameter such that the gain mismatch is reduced. The gain mismatch may be reduced to a predetermined tolerance level and/or for a predetermined amount of time. The tuning circuit may modify at least one parameter of the phase lock loop circuit. The at least one parameter may include the loop gain of the phase lock loop circuit. The gain mismatch detection circuit and the tuning circuit may be coupled in feedback for measuring the gain mismatch and modifying the at least one parameter such that the gain mismatch is reduced. The gain mismatch may be reduced to a predetermined tolerance level and/or for a predetermined amount of time. The tuning circuit may modify at least one parameter of the oscillator circuit. The at least one parameter may include the gain of the oscillator circuit. The gain mismatch detection circuit and the tuning circuit may be coupled in feedback for measuring the gain mismatch and modifying the at least one parameter such that the gain mismatch is reduced. The gain mismatch may be reduced to a predetermined tolerance level and/or for a predetermined amount of time. The tuning circuit may modify at least one parameter associated with the first modulation port. The at least one parameter may include the gain of the first modulation port. The gain mismatch detection circuit and the tuning circuit may be coupled in feedback for measuring the gain mismatch and modifying the at least one parameter such that the gain mismatch is reduced. The gain mismatch may be reduced to a predetermined tolerance level and/or for a predetermined amount of time. The system may further include a switched pre-emphasis filter coupled to the first modulation port responsive to the modulation data for increasing modulation bandwidth. The switched pre-emphasis filter may be selectively enabled and the second modulation port may be selectively disabled. The system may further include a switched pre-emphasis filter coupled to the first modulation port responsive to the modulation data for increasing modulation bandwidth of the phase lock loop circuit. The switched pre-emphasis filter may be selectively enabled and the second modulation port may be selectively disabled. The oscillator circuit may include a voltage controlled oscillator circuit.

This invention also features a phase lock loop RF modulator system including a phase lock loop circuit. The phase lock loop circuit includes a phase detector circuit responsive to an input reference signal and a feedback signal, an oscillator circuit responsive to the phase detector circuit for providing an output signal, a forward path from the phase detector circuit to the oscillator circuit, and a feedback path from the oscillator circuit to the phase detector circuit. The system also includes a first modulation port coupled to the feedback path, a second modulation port coupled to the forward path, a gain mismatch detection circuit responsive to modulation data and phase error between the reference signal and the feedback signal for providing an indicator output signal that represents the gain mismatch between the first modulation port and the second modulation port, and a tuning circuit responsive to the indicator output signal for modifying at least one parameter associated with one or more parameters of the first modulation port, the second modulation port, and the phase lock loop circuit such that the gain mismatch is reduced.

In a preferred embodiment, the gain mismatch may be reduced to a predetermined tolerance level and/or for a predetermined amount of time. The gain mismatch circuit and the tuning circuit may be coupled in feedback for measuring the gain mismatch and modifying the at least one parameter. The gain mismatch detection circuit may include at least one multiplier circuit for correlating the phase error between the reference signal and the feedback signal with the modulation data to provide the indicator output signal. The at least one parameter may include one or more parameters chosen from the group consisting of the gain of a second port modulation circuit, the loop gain of the phase lock loop circuit, the gain of the oscillator circuit, and the gain of the first modulation port.

This invention also features a phase lock loop RF modulator with gain matching between modulation ports including a phase lock loop circuit. The phase lock loop circuit includes a phase detector circuit responsive to an input reference signal and a feedback signal, a loop filter circuit responsive to the output of the phase detector circuit, an oscillator circuit responsive to the loop filter for providing an output signal, and a divider circuit for providing the feedback signal. The system also includes a first modulation port coupled to the divider circuit, a second modulation port coupled between the phase detector circuit and the oscillator circuit, and a gain mismatch circuit responsive to modulation data and a phase error between the reference signal and the feedback signal for providing an indicator output signal that represents the gain mismatch between the first modulation port and the second modulation port.

In a preferred embodiment, the system may further include a tuning circuit responsive to the indicator output signal for modifying at least one parameter associated with one or more parameters of the first modulation port, the second modulation port, and the phase lock loop circuit such that the gain mismatch is reduced. The gain mismatch may be reduced to a predetermined tolerance level and/or for a predetermined amount of time. The gain mismatch detection circuit may include at least one multiplier circuit for correlating the phase error between the reference signal and the feedback signal with the modulation data to provide the indicator output signal. The gain mismatch detection circuit and the tuning circuit may be coupled in feedback for measuring the gain mismatch and modifying the at least one parameter. The at least one parameter may include one or more parameters chosen from the group consisting of the gain of the second port modulation circuit, the loop gain of the phase lock loop circuit, the gain of the oscillator circuit, and the gain of the first modulation port.

This invention further features a method for measuring the gain mismatch between modulation ports of a phase lock loop RF modulator system, the method including the steps of detecting the phase error between an input reference signal and a feedback signal, providing an oscillating output signal, introducing modulation data to a first modulation port, introducing modulation data to a second modulation port, and measuring the gain mismatch between the first and second modulation ports by correlating the phase error with the modulation data.

In a preferred embodiment, the method may further include the step of modifying at least one parameter associated with the first modulation port such that the gain mismatch is reduced. The gain mismatch may be reduced to a predetermined tolerance level and/or for a predetermined amount of time. The at least one parameter may include the gain of the first modulation port. The method may further include the step of modifying at least one parameter associated with the second modulation port such that the gain mismatch may be reduced. The gain mismatch may be reduced to a predetermined tolerance level and/or for a predetermined amount of time. The at least one parameter may include one or more parameters chosen from the group consisting of the gain of a second port modulation circuit, the loop gain of the phase lock loop circuit, and the gain of the oscillator circuit. The method may further include the step of selectively disabling the second modulation port. The method may further include the step of selectively providing a pre-emphasis filter coupled to the first modulation port. The method may further include the step of selectively disabling the second modulation port.

BRIEF DESCRIPTION OF THE DRAWINGS

Other objects, features and advantages will occur to those skilled in the art from the following description of a preferred embodiment and the accompanying drawings, in which:

FIG. 5A is a waveform showing an example of the output of the gain mismatch detection circuit shown in FIG. 3 when the gain associated with the second modulation port is too low;

FIG. 5B is a graph showing an example of the output current pulses corresponding to the waveform shown in FIG. 5A;

FIG. 5C is a waveform showing an example of the output of the gain mismatch detection circuit shown in FIG. 3 when the gain associated with the second modulation port is too high;

FIG. 5D is a graph showing an example of the output current pulses corresponding to the waveform shown in FIG. 5C;

FIG. 6 is a graph showing an example when the output current pulses shown in FIGS. 5B and 5D are integrated by the gain mismatch detection circuit of this invention to provide an indication of the gain mismatch between the second modulation port and the first modulation port;

DISCLOSURE OF THE PREFERRED EMBODIMENT

Figure 1:
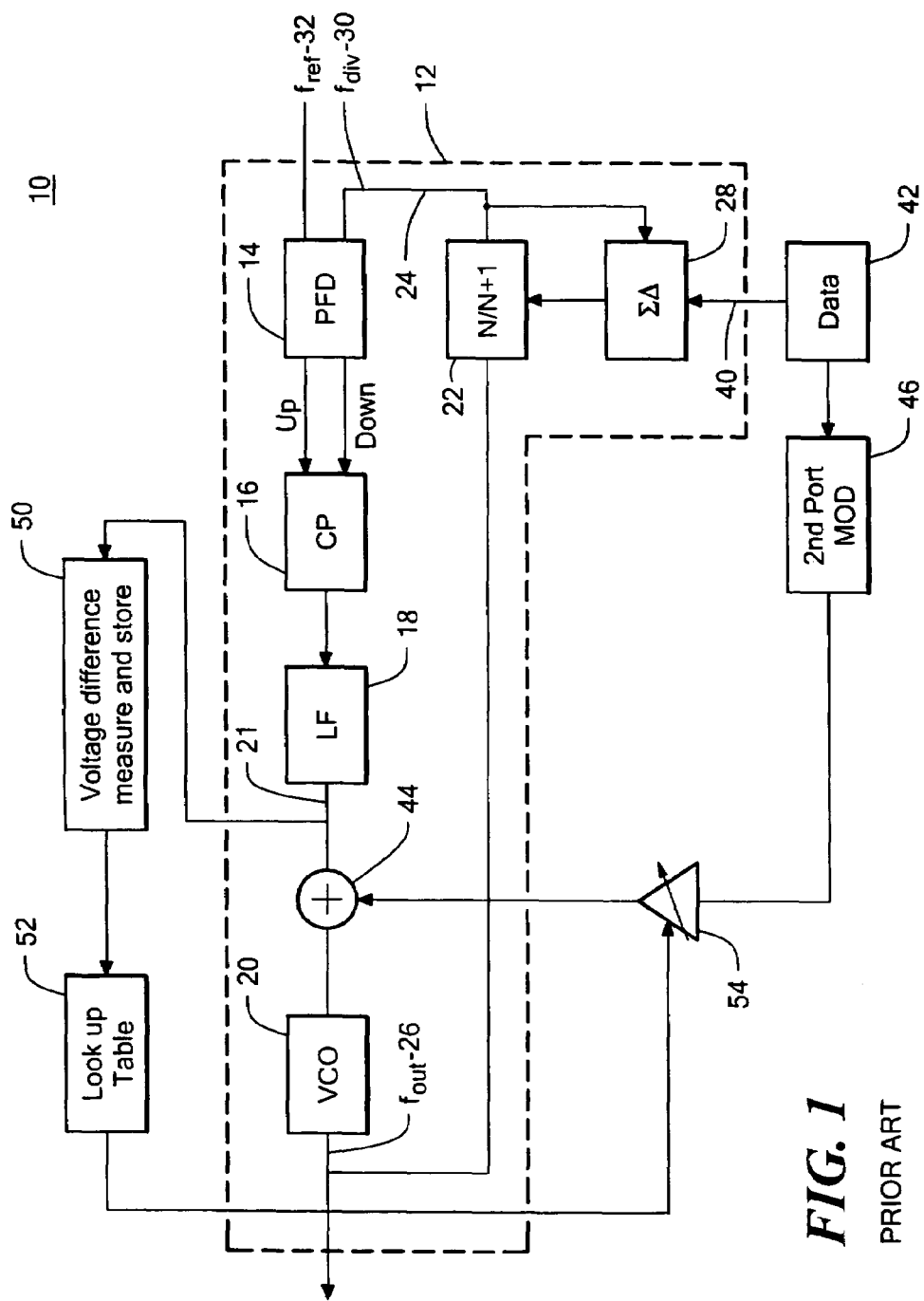
FIG. 1 is a schematic block diagram of a conventional two port phase lock loop RF modulator system employing a measure and adjust technique to match the gain of the two modulation ports.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, conventional PLL RF modulator system 10, FIG. 1 typically includes fractional-N PLL circuit 12. Circuit 12 typically includes phase/frequency detector 14, charge pump 16, loop filter 18, voltage controlled oscillator (VCO) 20 and N-divider circuit 22 in feedback loop 24 which divides the output frequency $f_{out}$ 26 by a number N to obtain feedback signal $f_{div}$ 30 which is one input to phase frequency detector 14. The other input to phase frequency detector 14 is $f_{ref}$ 32.

In operation, phase/frequency detector 14 senses any difference between $f_{ref}$ 32 and $f_{div}$ 30 and provides pulses in a direction of either up or down to charge pump 16 which then provides either positive or negative current pulses to loop filter 18. The current pulses are converted by loop filter 18 to a voltage which shifts the frequency output of VCO 20, $f_{out}$ 26, such that after division by N-divider circuit 22, $f_{div}$ 30 will approximately equal $f_{ref}$ 32. N-divider circuit 22 is typically responsive to ΣΔ modulator 28 in order to provide the fractional value for N needed for fractional-N PLL circuit 12.

System 10 includes first modulation port 40 responsive to modulation data 42 that has a low pass frequency characteristic to remove unwanted noise. Second modulation port 44 is typically introduced between loop filter 18 and VCO 20 and is responsive to modulation data 42 that has been converted to analog signals by second port modulation circuit 46. Second modulation port 44 typically has a high pass frequency characteristic that allows PLL circuit 12 to accommodate higher data rates. However, as discussed in the Background section above, the gain associated with second modulation port 44 is often not as expected, while the gain of first modulation port 40 is more predictable. The result is the gain of second modulation port 44 typically does not match the gain of first modulation port 40 causing system 10 to malfunction.

Conventional PLL RF modulator system 10 is designed to measure the gain associated with second modulation port 44 by programming PLL circuit 12 to one frequency and measuring the input control voltage to VCO 20 on line 21 with voltage difference measurement circuit 50. PLL circuit 12 is then programmed to a second frequency and the input control voltage on line 21 is measured again by voltage difference measurement circuit 50. The measured voltage difference is then used typically in look up table 52 to enable variable gain amplifier 54 to set the gain associated with second modulation port 44 to approximately match the gain of first modulation port 40.

However, conventional modulator system 10 provides no feedback and cannot determine if the gain adjustment to second modulation port 44 is compensated as required. Moreover, using voltage difference measurement circuit 50 requires taking modulator system 10 offline and out of production, which is complicated and expensive.

Figure 2:
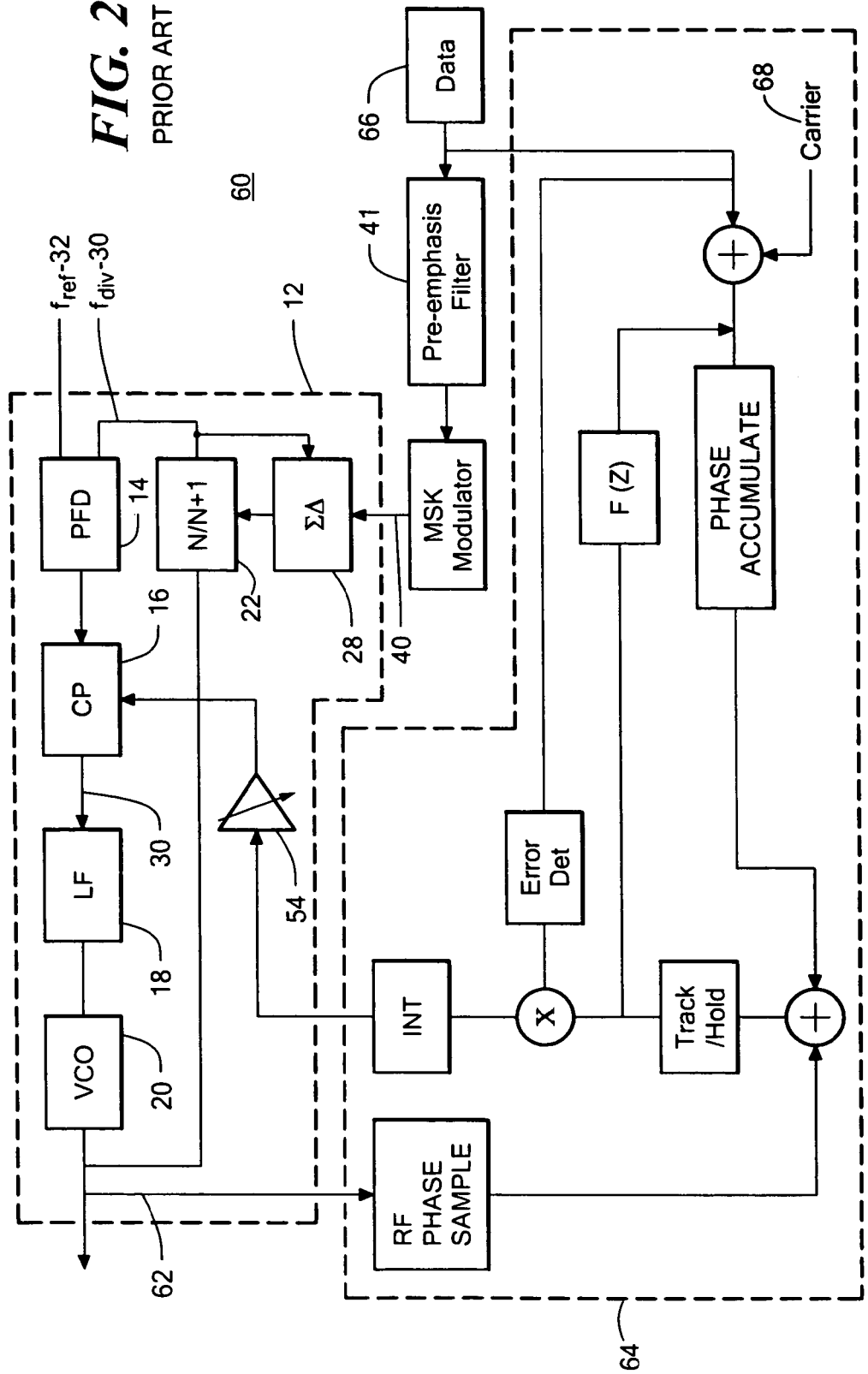
FIG. 2 is a schematic block diagram of a conventional pre-emphasis phase lock loop RF modulator system employing RF phase measurement and feedback to match the response of the digital pre-emphasis filter to response of the PLL.

Another conventional PLL RF modulator system 60, FIG. 2, where like parts have been given like numbers, measures the output phase of PLL circuit 12 using RF quadrature phase sampling. Measurement loop 64 is responsive to the output of PLL circuit 12 by line 62 and compares the output RF phase on line 62 with an estimate of a desired phase due to modulation data 66 and channel data 68. This is used to determine if the output phase is as desired. Variable gain amplifier 54 is responsive to the output of loop 64 and adjusts the gain of PLL circuit 12 to reduce the gain mismatch between pre-emphasis filter 41 and at PLL circuit 12. However, modulation system 60 requires quadrature sampling and measurement loop 64, which is expensive and complicated.

Figure 3:
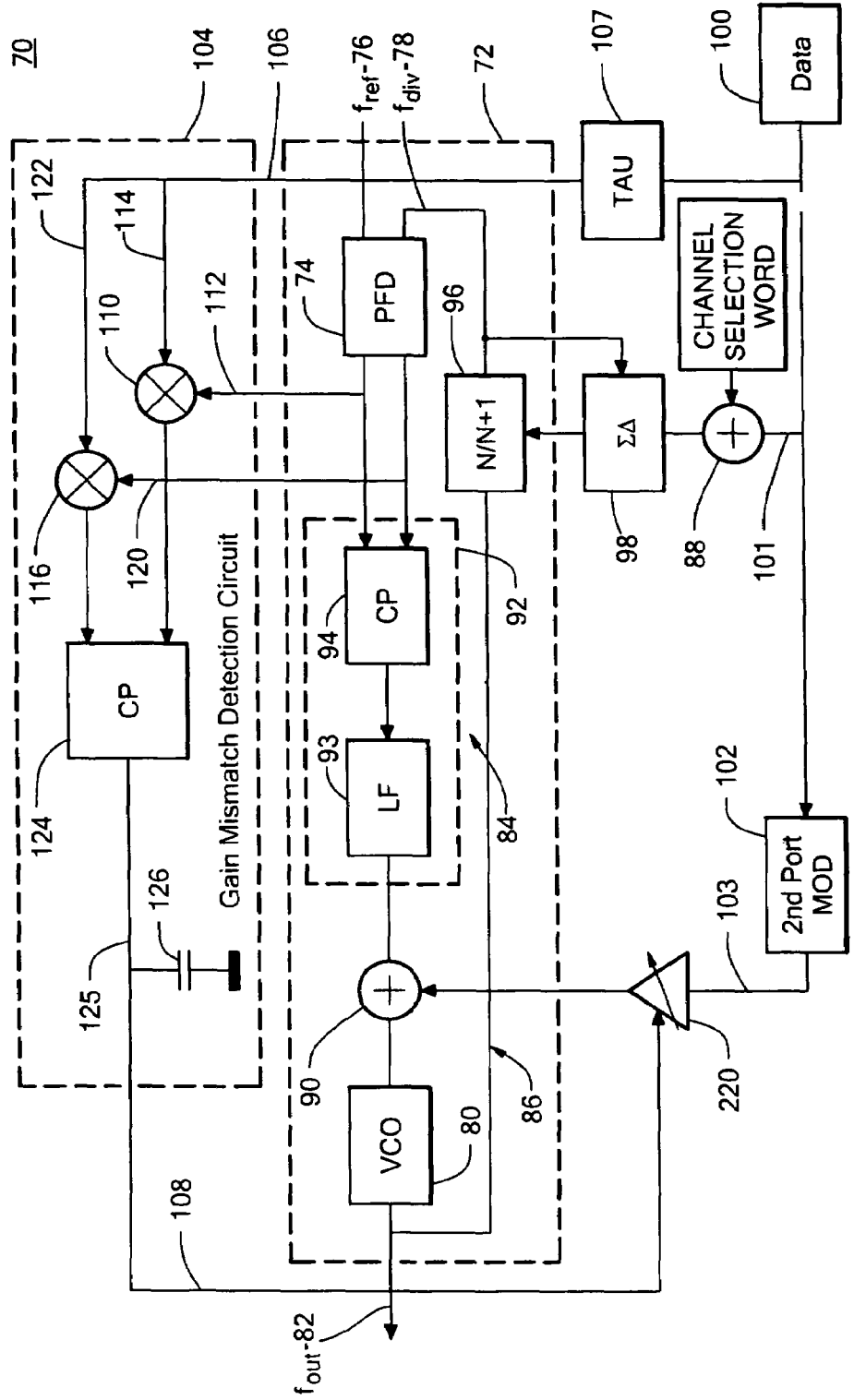
FIG. 3 is a schematic block diagram of one example of a phase lock loop RF modulator system in accordance with this invention used to measure the gain mismatch between the first and second modulation ports and that adjusts the gain associated with the second modulation port.

In contrast, a phase lock loop RF modulator system 70, FIG. 3, in accordance with this invention includes phase lock loop circuit 72. Phase lock loop circuit 72 includes phase detector circuit 74 responsive to input reference signal $f_{ref}$ 76 and feedback signal $f_{div}$ 78, and oscillator circuit 80, e.g., a VCO or similar type device, responsive to phase detector circuit 74 that provides output signal $f_{out}$ 82. Phase detector circuit 74 senses any difference between input reference signal $f_{ref}$ 76 and feedback signal $f_{div}$ 78 and applies a voltage to oscillator circuit 80 that shifts the frequency of output signal $f_{out}$ 82 such that the frequency of input reference signal $f_{ref}$ 76 will approximately match the frequency of feedback signal $f_{div}$ 78, similar as discussed above in reference to FIG. 1. In a preferred design, phase detector circuit 74 is a phase frequency detector. PLL circuit 72 also includes forward path 84 from phase detector circuit 74 to oscillator circuit 80 and feedback path 86 from oscillator circuit 80 to phase detector circuit 74. In a preferred design, forward path 84 includes loop filter circuit 92 with loop filter 93 and charge pump circuit 94. Feedback path 86 preferably includes divider circuit 96, e.g., and N-divider circuit, which divides output signal $f_{out}$ 82 by N to obtain feedback signal $f_{div}$ 78. Divider circuit 96 is typically responsive to ΣΔ modulator 98 to provide the fractional value of N in feedback path 86 so that PLL circuit 72 operates as a fractional-N PLL, similar as discussed above.

PLL RF modulator system 70 also includes first modulation port 88 coupled to feedback path 86 and second modulation port 90 coupled to forward path 84. First modulation port 88 is responsive to modulation data 100 by line 101 and second modulation port 90 is responsive to modulation data 100 on line 103 that has been converted to analog signals by second port modulation circuit 102. Second modulation port 90 is preferably introduced between loop filter 92 and oscillator circuit 80. However, second modulation port 90 may be introduced at any desired point in forward path 84.

Gain mismatch detection circuit 104 is responsive to modulation data 100 by line 106, which may be delayed by delay circuit 107, and the phase error between reference signal $f_{ref}$ 76 and feedback signal $f_{div}$ 78 by line 112 and/or line 120 measured by phase detector circuit 74. Gain mismatch detection circuit 104 provides an indicator output signal on line 108 that represents the gain mismatch between first modulation port 88 and second modulation port 90, as discussed in further detail below.

Gain mismatch detection circuit 104 includes multiplier circuit 110 that correlates the phase error between reference signal $f_{ref}$ 76 and feedback signal $f_{div}$ 78 by line 112 with modulation data 100 by line 114 to provide the indicator output signal on line 108 that represents the gain mismatch between first modulation port 88 and second modulation port 90. Gain mismatch detection circuit 104 may include a plurality of multiplier circuits, such as multiplier circuit 110 and multiplier circuit 116. In this example, multiplier circuit 116 correlates the phase error between reference signal $f_{ref}$ 76 and feedback signal $f_{div}$ 78 by line 120 with modulation data 100 by line 122 that with multiplier circuit 110 provides the indicator output signal on line 108 that represents the gain mismatch between first modulation port 88 and second modulation port 90. Gain mismatch detection circuit 104 typically includes charge pump circuit 124 responsive to the output of multiplier circuit 110 and/or multiplier circuit 116. Charge pump circuit 124 generates output current pulses on line 125 to charge capacitor 126 which acts as an integrator.

Figure 4A:
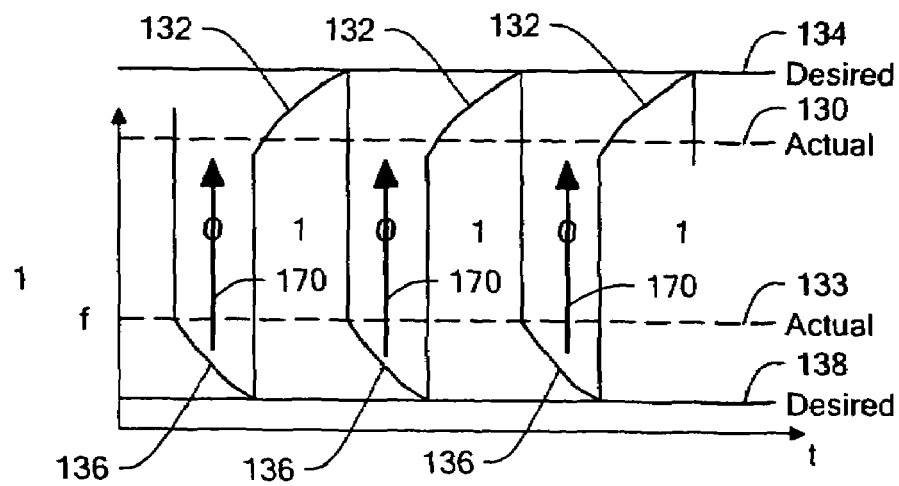
FIG. 4A is a waveform depicting the PLL output frequency when the gain of the second modulation port shown in FIG. 3 is too low.
Figure 4B:
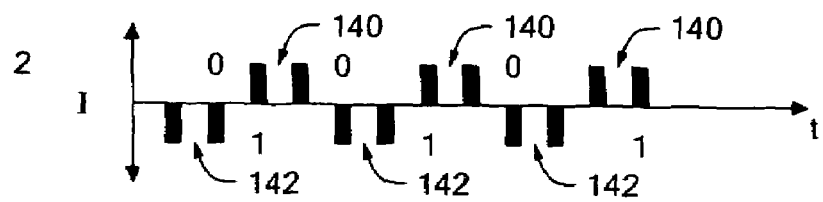
FIG. 4B is a graph showing an example of the charge pump output current pulses corresponding to the waveform shown in FIG. 4A.

In one example operation, when the modulation data added to second modulation port 90 by line 103 is too small to match the modulation data added to first modulation port 88 by line 101, the initial output modulation frequency deviation associated with second modulation port 90 will not be large enough, e.g., the gain associated with second modulation port 90 is too low. FIG. 4A shows the desired output modulation frequency deviation for second modulation port 90 at 134 and 138 and the actual output modulation frequency deviation associated with second modulation port 90 at 130 and 133. In response, phase detector circuit 74, FIG. 3, of PLL circuit 72 pumps up for modulation data representing a logical 1, indicated at 132, FIG. 4A, and pumps down for modulation data representing a logical 0, indicated at 136, to achieve the desired output modulation frequency deviation indicated at 134 and 138. The corresponding current pulses output by charge pump circuit 94, FIG. 3, in response to phase detector circuit 74 pumping up for a logical 1 and down for a logical 0 are indicated by current pulses 140 and 142, FIG. 4B, respectively.

Figure 4C:
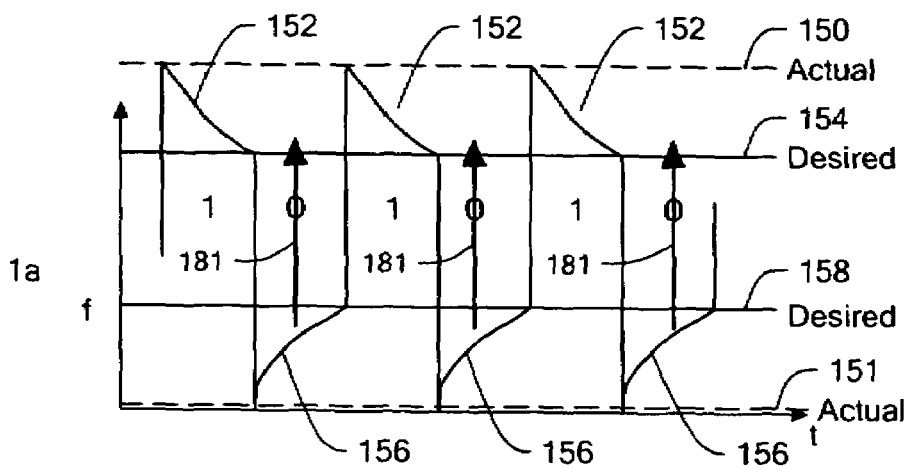
FIG. 4C is a waveform depicting the PLL output frequency when the gain of the second modulation port shown in FIG. 3 is too high.
Figure 4D:
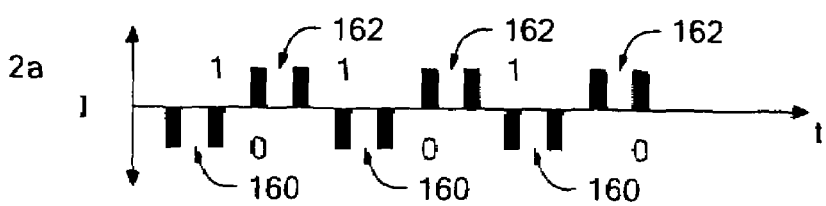
FIG. 4D is a graph showing an example of the charge pump output current pulses corresponding to the waveform shown in FIG. 4C.

Similarly, in another example operation when the modulation data added to second modulation port 90, FIG. 3, is too large to match the modulation data added to first modulation port 88, the initial output modulation frequency deviation associated with second modulation port 90 will be too large, e.g., the gain associated with second modulation port 90 is too high. FIG. 4C shows the desired output modulation frequency deviation at 154 and 158 and the actual output modulation frequency deviation at 150 and 151. In this example, phase detector circuit 74, FIG. 3, pumps down for a logical 1, indicated at 152, and pumps up for a logical 0, indicated at 156, to bring the output modulation frequency deviation of second modulation port 90 to the desired output modulation frequency deviation at 154 and 158. The corresponding current pulses output by charge pump circuit 94, FIG. 3, in response to phase detector circuit 74 pumping down for a logical 1 and up for a logical 0 are indicated by current pulses 160 and 162, FIG. 4D, respectively. Those skilled in the art will understand that in the above examples are, a logical 1 need not be a higher frequency and a logical 0 a lower frequency and system 70 may use various types of modulation, e.g. FSK modulation, and the like.

Gain mismatch detection circuit 104, FIG. 3, in a preferred design includes multiplier circuit 110, e.g., an XOR gate circuit or similar type device, and/or multiplier circuit 116, that correlates, or mixes, the output of phase detector circuit 74 with modulation data 100 so that every logical 0 output by phase detector circuit 70 is flipped. Similar mixing methods can be used by those skilled in the art, e.g., flipping every logical 1, or using phase detector outputs during a logical transition, and equivalents thereof. This is then used to provide an indication if the gain of second modulation port 90 is too low or too high when compared to first modulation port 88.

For example, when the output modulation frequency deviation associated with second modulation port 90 is too low, indicated at 130 and 133, FIG. 4A, multiplier circuit 110, FIG. 3, and/or multiplier circuit 116 correlates the output of phase detector circuit 74 with modulation data, indicated by arrows 170, FIG. 4A, so that every logical 0 is flipped. FIG. 5A shows an example of the output of gain mismatch detection circuit 104 at 184 after every logical 0 has been flipped. The output from multiplier circuit 110 and/or multiplier circuit 116 of gain mismatch detection circuit 104, FIG. 3, is input to charge pump 124 which generates current pulses 190, FIG. 5B, which are on average positive. The output of charge pump circuit 124 is stored on capacitor 126 which performs the integration to provide the indicator output signal on line 108 that indicates the gain associated with second modulation port 90 is too low when compared to first modulation port 88.

Similarly, when the output modulation frequency deviation or gain associated with second modulation port 90 is too high, indicated at 150 and 151, FIG. 4C, multiplier circuit 110, FIG. 3, and/or multiplier circuit 116 correlates the output of phase detector circuit 74 with modulation data, indicated by arrows 181, FIG. 4C, so that every logical 0 is flipped. FIG. 5C shows an example of the output of multiplier circuit 110 and/or multiplier circuit 116 of gain mismatch detector circuit 104 at 187 after every logical 0 has been flipped. The output of multiplier circuit 110 and/or multiplier circuit 116 is similarly input to charge pump circuit 124 which generates current pulses 200, FIG. 5D, that are on average negative. The output of charge pump circuit 124 is stored on capacitor 126 which is integrated to provide the indicator output signal on line 108 that indicates the gain associated with second modulation port 90 is too high when compared to first modulation port 88. This is used to indicate the gain associated with modulation port 90 is too high when compared to first modulation port 88.

Thus, when output pulses generated by charge pump circuit 124 and stored on capacitor 126 are integrated, the integration goes in the direction indicated by arrow 210, FIG. 6, when the gain of second modulation port 90 is too low when compared to first modulation port 88, and in the direction indicated by arrow 212 when the gain of second modulation port 90 is too high.

The result is PLL RF modulator system 70 with gain mismatch detection circuit 104 detects the gain mismatch between second modulation port 90 and first modulation port 88 without the need for taking system 70 offline and out of production, using quadrature sampling, or complicated circuits as found in the prior art. The result is system 70 is less expensive and utilizes less power and die space. Moreover, first modulation port 88 has a low pass bandwidth characteristic which removes unwanted noise and second modulation port 90 has a high pass bandwidth characteristic which accommodates high modulation data rates.

In one preferred embodiment, system 70 includes tuning circuit 220, FIG. 3, responsive to the indicator output signal on line 108 that represents the gain mismatch between second modulation port 90 and first modulation port 88. Tuning circuit 220, e.g., a variable gain amplifier circuit or similar type circuit adjusts the gain on at least one parameter associated with second modulation port 90 so that the gain mismatch between second modulation port 90 and first modulation port 88 is reduced, e.g., the gain of second modulation port 90 approximately matches the gain of first modulation port 88. Tuning circuit 220 is preferably coupled in feedback with gain mismatch detection circuit 104 by line 108 and modifies at least one parameter associated with second port modulation circuit 102, e.g., the gain of second port modulation circuit 102, until the gain mismatch between second modulation port 90 and first modulation port 88 is reduced, preferably, to a predetermined tolerance level, e.g., a 5% gain mismatch or a predetermined amount of time, e.g., six times the calibration time constant.

Tuning circuit 220 may also modify a parameter associated with PLL circuit 72, e.g., the loop gain of PLL circuit 72 so that the gain mismatch between second modulation port 90 and first modulation port 88 is reduced.

Figure 7:
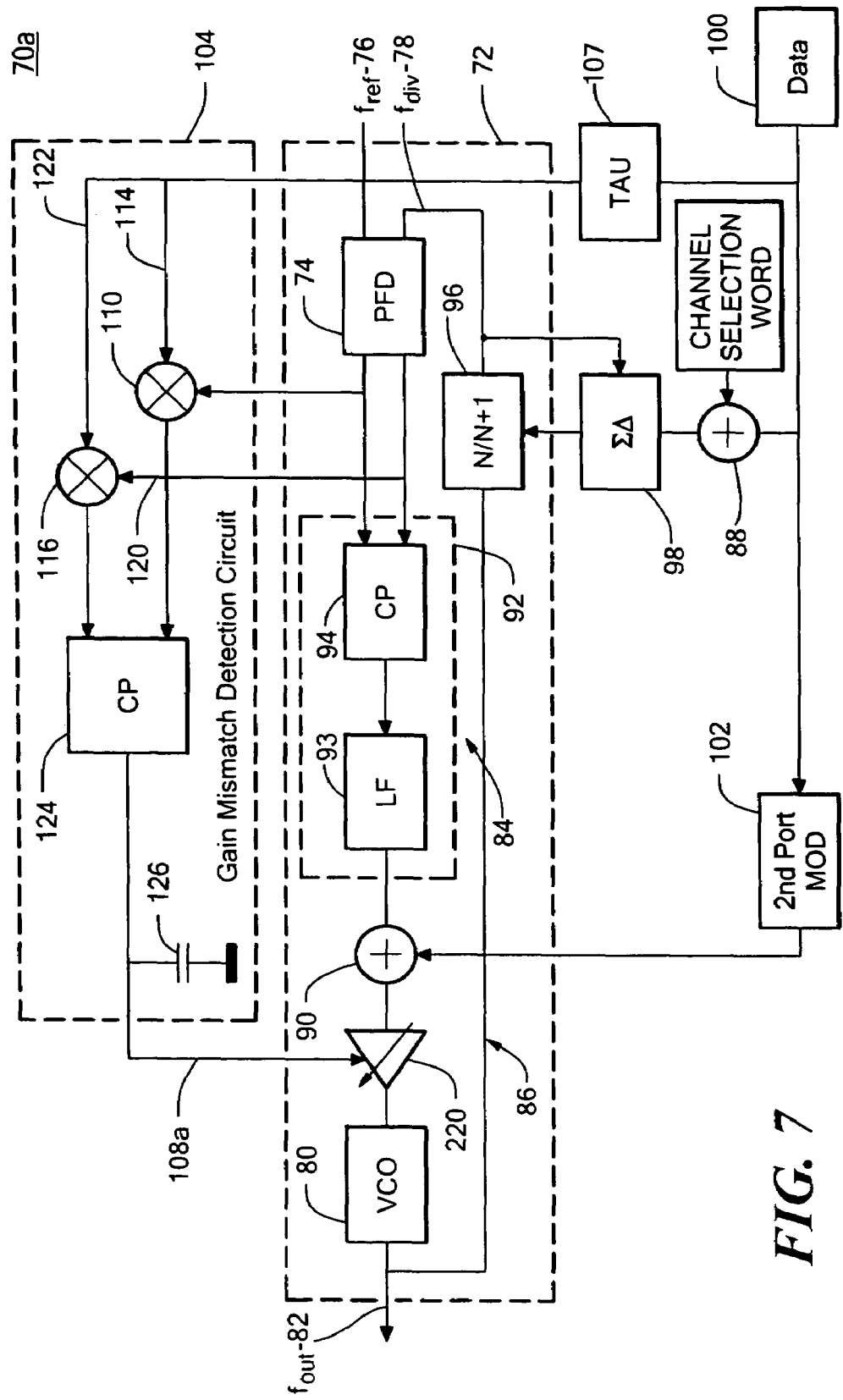
FIG. 7 is a schematic block diagram of another example of the RF modulator system in accordance with this invention used to measure the gain mismatch between the first and second modulation ports and that adjusts the gain of the PLL circuit.

Phase lock loop RF modulator system 70a, FIG. 7 of this invention, where like parts have been given like numbers, includes tuning circuit 220 coupled in feedback with gain mismatch detection circuit 104 by line 108a. Similarly, gain mismatch detection circuit 104 measures the gain mismatch between first modulation port 88 and second modulation port 90 to provide the indicator output signal on line 108a that represents the gain mismatch between first modulation port 88 and second modulation port 90. Tuning circuit 220 is responsive to indicator output signal on line 108a and modifies at least one parameter of oscillator circuit 80, e.g., the gain of oscillator circuit 80, so that the gain mismatch between second modulation port 90 and first modulation port 88 is reduced, preferably to the predetermined tolerance level described above.

Figure 8:
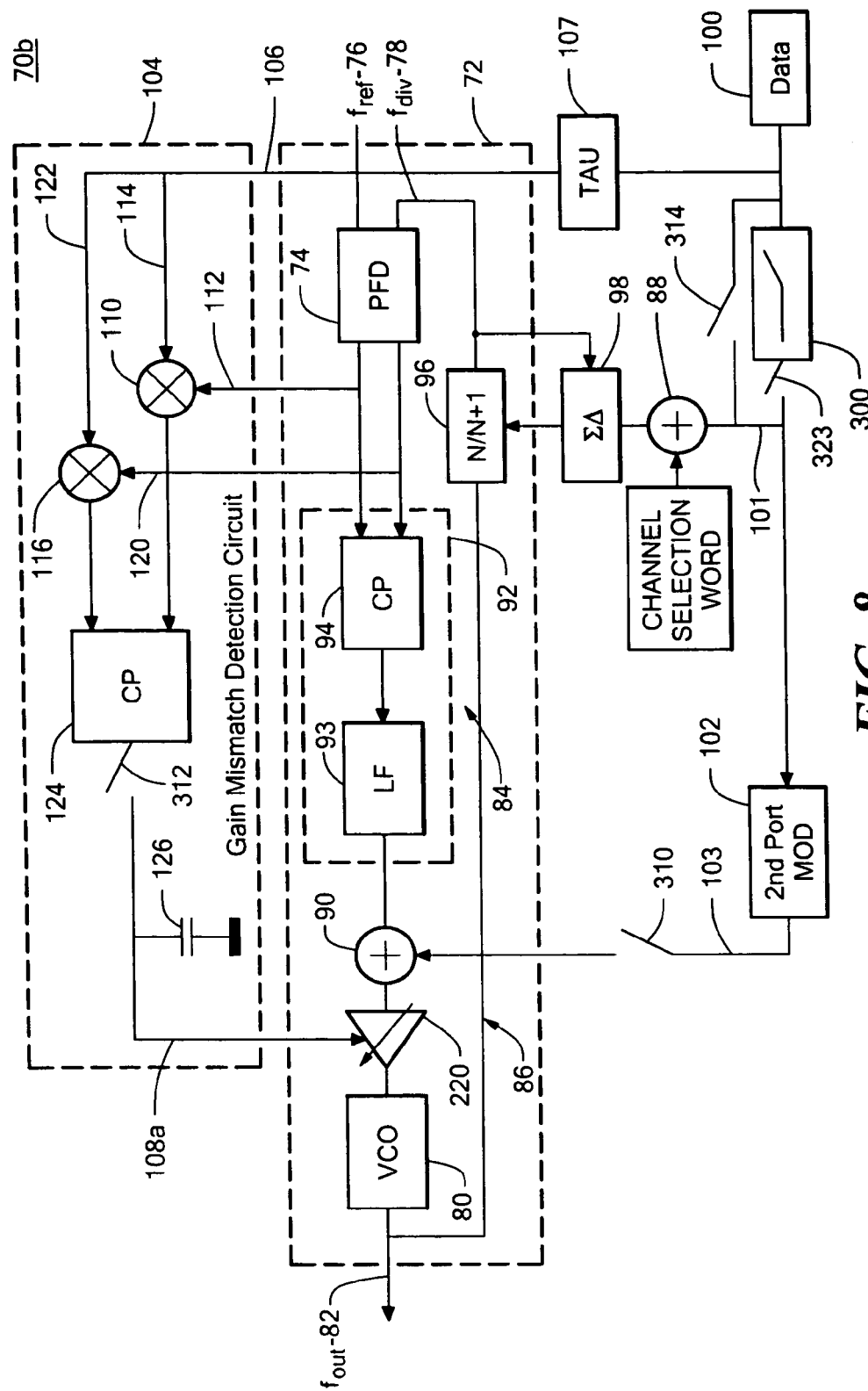
FIG. 8 is a schematic block diagram of another embodiment of the RF modulator shown in FIG. 7 that includes a switched pre-emphasis filter.
Figure 9:
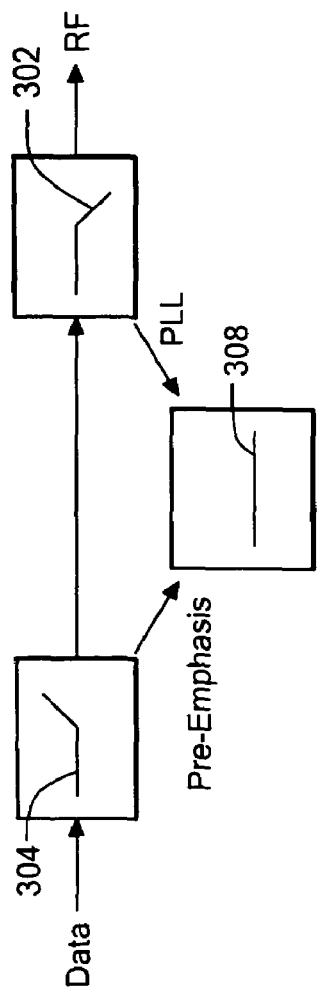
FIG. 9 is a schematic block diagram showing the bandwidth characteristics of the pre-emphasis digital filter and the PLL circuit shown in FIG. 8.

Phase lock loop RF modulator system 70b, FIG. 8 of this invention, where like parts have been given like numbers, similarly includes gain mismatch detection circuit 104 coupled in feedback to tuning circuit 220 by line 108a that detects and reduces the gain mismatch between first modulation port 88 and second modulation port 90. System 70b includes switched pre-emphasis filter 300 coupled to first modulation port 88 that increases the bandwidth of PLL circuit 72. Typically, switched pre-emphasis filter 300 is a digital filter and is responsive to modulation data 100. Switched pre-emphasis filter 300 is constructed with the inverse transfer function of PLL circuit 72. An example of the transfer function of PLL circuit 72 is shown at 302, FIG. 9, and an example of the transfer function of switched pre-emphasis filter 300 is shown at 304. Thus, when pre-emphasis filter 300, FIG. 8, is combined with PLL circuit 72, system 70b has virtually infinite bandwidth, as shown by transfer function at 306, FIG. 9.

In operation, the gain mismatch between first modulation port 88 and second modulation port 90 is measured and adjusted, e.g., calibrated, by gain mismatch detection circuit 104 and tuning circuit 220. During calibration of system 70b, switching devices 310, 312 and 314 are closed and switching device 323 is open, by-passing switched pre-emphasis filter 300. Once the gain mismatch between first modulation port 88 and second modulation port 90 is reduced to a predetermined tolerance level, or a predetermined amount of time has passed, switching device 312 is opened to hold, or freeze, the adjustment made to the gain associated with second modulation port 90. Switching device 310 is also opened to remove the effect of noise associated with second modulation port 90. Switching device 314 is then opened and switching device 323 in series with the pre-emphasis filter is closed, enabling pre-emphasis filter 300, thus allowing PLL circuit 72 to operate as a pre-emphasis modulator.

Figure 10:
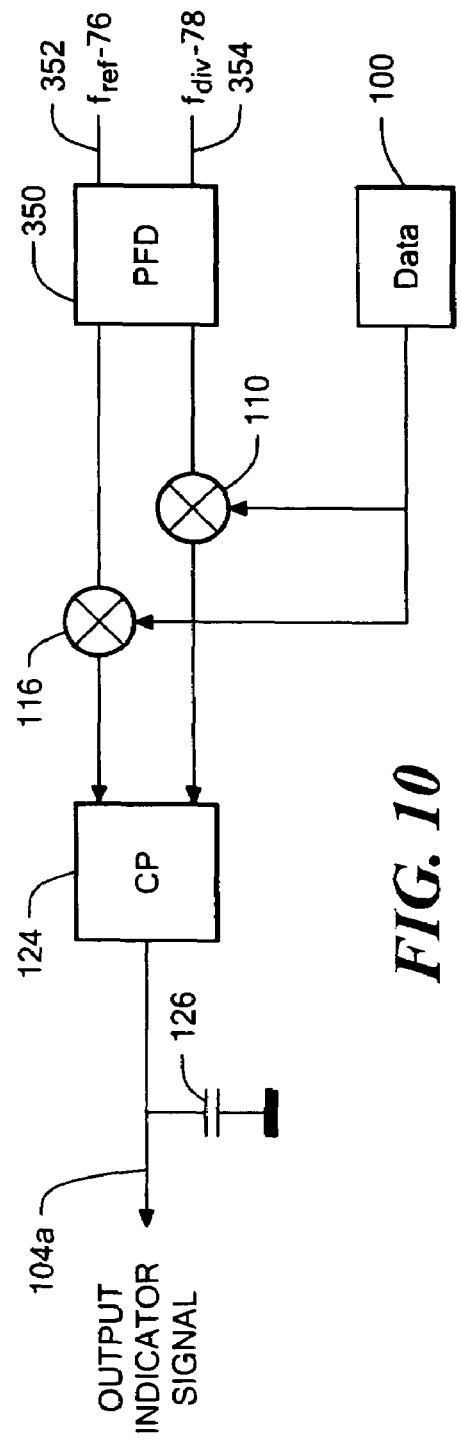
FIG. 10 is a schematic block diagram showing in further detail the components of another embodiment of the gain mismatch detection circuit of this invention.

Gain mismatch detection circuit 104a, FIG. 10, where like parts have been given like numbers, may include its own phase detector circuit 350, e.g., a phase frequency detector circuit, responsive to reference signal $f_{ref}$ 76 and feedback signal $f_{div}$ 78 by lines 352 and 354, respectively. Gain mismatch detection circuit 104a similarly includes multiplier circuit 110 and/or multiplier circuit 116, charge pump circuit 124 and capacitor 126.

Figure 11:
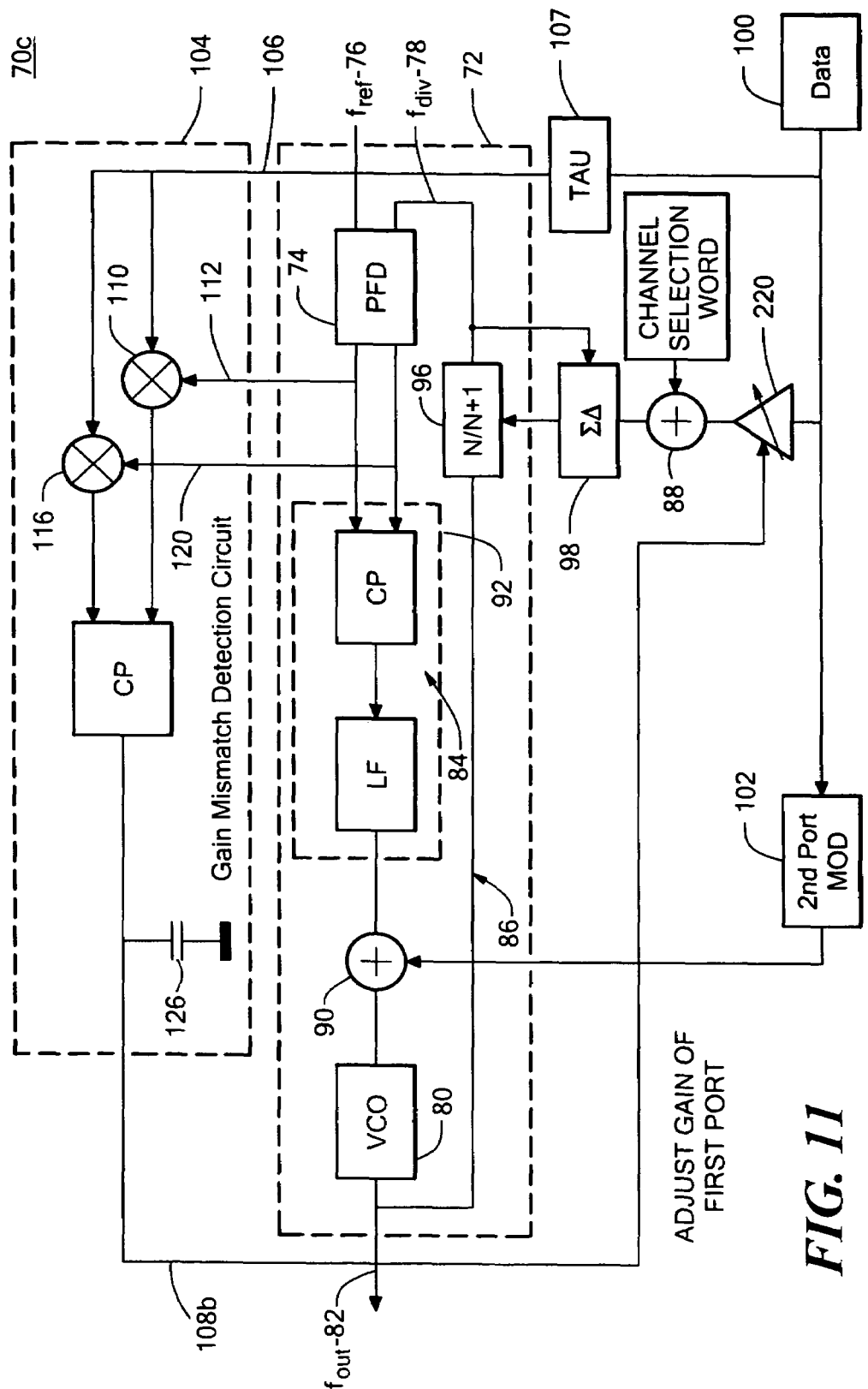
FIG. 11 is a schematic block diagram of another embodiment of the RF modulator system of this invention that measures the gain mismatch between the first and second modulation ports and that adjusts the gain associated with the first modulation port.

Another PLL RF modulator system 70c, FIG. 11, where like parts have been given like numbers, of this invention includes gain mismatch detection circuit 104 and tuning circuit 220 coupled in feedback by line 108b. In this embodiment, tuning circuit 220 is coupled to first modulation port 88. Gain mismatch detection circuit 104 detects the gain mismatch between first modulation port 88 and second modulation port 90. Tuning circuit 220 modifies at least one parameter associated with first modulation port 88, e.g., the gain of first modulation port 88, such that the gain mismatch between first modulation port 88 and second modulation port 98 is reduced, ideally to the predetermined tolerance level discussed above.

The result is PLL RF modulator system 70 described above with reference to FIGS. 3-11 measures the gain mismatch between first modulation port 88 and second modulation port 90 with a relatively simple design when compared to conventional RF modulator systems. This reduces the power and die area needed by system 70. Modulator system 70 also eliminates the need for RF phase sampling and does not need to be taken offline and out of production in order to measure the gain mismatch between first modulation port 88 and second modulation port 90 and adjust the gain associated with second modulation port 90 so that it matches the gain of first modulation port 88. Hence, modulator system 70 is less expensive and more efficient than prior art modulation systems. Because gain mismatch detection circuit 104 is coupled in feedback with tuning circuit 220, modulator system 70 can continuously measure the gain mismatch between first modulation port 88 and second modulation port 90 and then reduce that gain mismatch to a predetermined tolerance level. Hence, modulator system 70 can continuously compensate for variations in production of the components of PLL circuit 72, temperature variations, voltage supply variations, and the like, that affect the gain of second modulation port 90.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed:

those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A phase lock loop RF modulator system comprising:
   a phase lock loop circuit including:
   a phase detector circuit responsive to an input reference signal and a feedback signal;
   an oscillator circuit responsive to said phase detector circuit for providing an output signal;
   a forward path from said phase detector circuit to said oscillator circuit, and
   a feedback path from said oscillator circuit to said phase detector circuit;
   a first modulation port coupled to said feedback path;
   a second modulation port coupled to said forward path; and
   a gain mismatch detection circuit responsive to modulation data and a phase error between said reference signal and said feedback signal for providing an indicator output signal that represents the gain mismatch between said first modulation port and said second modulation port.

2. The system of claim 1 in which said forward path includes a loop filter circuit responsive to the output of said phase detector circuit.

3. The system of claim 1 in which said loop filter further includes a charge pump circuit.

4. The system of claim 1 in which said feedback path includes a divider circuit.

5. The system of claim 1 in which said gain mismatch detection circuit includes at least one multiplier circuit for correlating said phase error between said reference signal and said feedback signal with said modulation data to provide said indicator output signal.

6. The system of claim 1 in which said gain mismatch detection circuit includes a plurality of multiplier circuits for correlating said phase error between said reference signal and said feedback signal with said modulation data to provide said indicator output signal.

7. The system of claim 1 in which said gain mismatch detection circuit includes a low pass filter.

8. The system of claim 7 in which said low pass filter includes an integrator circuit.

9. The system of claim 7 in which said low pass filter includes a charge pump circuit.

10. The system of claim 1 in which said gain mismatch detection circuit is responsive to said phase detector circuit.

11. The system of claim 1 in which said phase detector circuit includes a phase frequency detector circuit.

12. The system of claim 11 in which said gain mismatch detection circuit is responsive to said phase frequency detector circuit.

13. The system of claim 1 in which said gain mismatch detection circuit includes a phase detector circuit.

14. The system of claim 13 in which said phase detector circuit includes a phase frequency detector circuit.

15. The system of claim 1 in which said phase lock loop circuit comprises a fractional-N phase lock loop circuit.

16. The system of claim 15 in which said fractional-N phase lock loop circuit includes a $\Sigma\Delta$ modulator circuit.

17. The system of claim 1 further including a tuning circuit responsive to said indicator output signal.

18. The system of claim 17 in which said tuning circuit modifies at least one parameter associated with said second modulation port.

19. The system of claim 18 in which said gain mismatch detector circuit and said tuning circuit are coupled in feedback for measuring said gain mismatch and modifying said at least one parameter such that said gain mismatch is reduced.

20. The system of claim 19 in which said gain mismatch is reduced to a predetermined tolerance level and/or for a predetermined amount of time.

21. The system of claim 17 further including a second port modulation circuit coupled to said second modulation port responsive to said modulation data for converting said modulation data to analog signals.

22. The system of claim 21 in which said tuning circuit modifies at least one parameter of said second port modulation circuit.

23. The system of claim 22 in which said at least one parameter includes the gain of said second port modulation circuit.

24. The system of claim 22 in which said gain mismatch detection circuit and said tuning circuit are coupled in feedback for measuring said gain mismatch and modifying said at least one parameter such that said gain mismatch is reduced.

25. The system of claim 24 in which said gain mismatch is reduced to a predetermined tolerance level and/or for a predetermined amount of time.

26. The system of claim 17 in which said tuning circuit modifies at least one parameter of said phase lock loop circuit.

27. The system of claim 26 in which said at least one parameter includes the loop gain of said phase lock loop circuit.

28. The system of claim 26 in which said gain mismatch detection circuit and said tuning circuit are coupled in feedback for measuring said gain mismatch and modifying said at least one parameter such that said gain mismatch is reduced.

29. The system of claim 28 in which said gain mismatch is reduced to a predetermined tolerance level and/or for a predetermined amount of time.

30. The system of claim 17 in which said tuning circuit modifies at least one parameter of said oscillator circuit.

31. The system of claim 30 in which said at least one parameter includes the gain of said oscillator circuit.

32. The system of claim 30 in which said gain mismatch detection circuit and said tuning circuit are coupled in feedback for measuring said gain mismatch and modifying said at least one parameter such that said gain mismatch is reduced.

33. The system of claim 32 in which said gain mismatch is reduced to a predetermined tolerance level and/or for a predetermined amount of time.

34. The system of claim 17 in which said tuning circuit modifies at least one parameter associated with said first modulation port.

35. The system of claim 34 in which said at least one parameter includes the gain of said first modulation port.

36. The system of claim 34 in which said gain mismatch detection circuit and said tuning circuit are coupled in feedback for measuring said gain mismatch and modifying said at least one parameter such that said gain mismatch is reduced.

37. The system of claim 36 in which said gain mismatch is reduced to a predetermined tolerance level and/or for a predetermined amount of time.

38. The system of claim 1 further including a switched pre-emphasis filter coupled to said first modulation port responsive to said modulation data for increasing modulation bandwidth.

39. The system of claim 38 in which said switched pre-emphasis filter is selectively enabled and said second modulation port is selectively disabled.

40. The system of claim 26 further including a switched pre-emphasis filter coupled to said first modulation port responsive to said modulation data for increasing modulation bandwidth of said phase lock loop circuit.

41. The system of claim 40 in which said switched pre-emphasis filter is selectively enabled and said second modulation port is selectively disabled.

42. The system of claim 1 in which said oscillator circuit includes a voltage controlled oscillator circuit.

43. A phase lock loop RF modulator system comprising:
   a phase lock loop circuit including:
      a phase detector circuit responsive to an input reference signal and a feedback signal;
      an oscillator circuit responsive to said phase detector circuit for providing an output signal;
      a forward path from said phase detector circuit to said oscillator circuit, and
      a feedback path from said oscillator circuit to said phase detector circuit;
   a first modulation port coupled to said feedback path;
   a second modulation port coupled to said forward path;
   a gain mismatch detection circuit responsive to modulation data and phase error between said reference signal and said feedback signal for providing an indicator output signal that represents the gain mismatch between said first modulation port and said second modulation port; and
   a tuning circuit responsive to said indicator output signal for modifying at least one parameter associated with one or more of said first modulation port, said second modulation port, and said phase lock loop circuit such that said gain mismatch is reduced.

44. The system of claim 43 in which said gain mismatch is reduced to a predetermined tolerance level and/or for a predetermined amount of time.

45. The system of claim 43 in which said gain mismatch circuit and said tuning circuit are coupled in feedback for measuring said gain mismatch and modifying said at least one parameter.

46. The system of claim 43 in which said gain mismatch detection circuit includes at least one multiplier circuit for correlating said phase error between said reference signal and said feedback signal with said modulation data to provide said indicator output signal.

47. The system of claim 43 in which said at least one parameter includes one or more parameters chosen from the group consisting of: the gain of a second port modulation circuit, the loop gain of said phase lock loop circuit, the gain of said oscillator circuit, and the gain of said first modulation port.

48. A phase lock loop RF modulator with gain matching between modulation ports comprising:
   a phase lock loop circuit including:
      a phase detector circuit responsive to an input reference signal and a feedback signal;
      a loop filter circuit responsive to the output of said phase detector circuit;
      an oscillator circuit responsive to said loop filter for providing an output signal, and
      a divider circuit for providing said feedback signal;
   a first modulation port coupled to said divider circuit;
   a second modulation port coupled between said phase detector circuit and said oscillator circuit; and
   a gain mismatch circuit responsive to modulation data and a phase error between said reference signal and said feedback signal for providing an indicator output signal that represents the gain mismatch between said first modulation port and said second modulation port.

49. The system of claim 48 further including a tuning circuit responsive to said indicator output signal for modifying at least one parameter associated with one or more of said first modulation port, said second modulation port, and said phase lock loop circuit such that said gain mismatch is reduced.

50. The system of claim 49 in which said gain mismatch is reduced to a predetermined tolerance level and/or for a predetermined amount of time.

51. The system of claim 48 in which said gain mismatch detection circuit includes at least one multiplier circuit for correlating said phase error between said reference signal and said feedback signal with said modulation data to provide said indicator output signal.

52. The system of claim 49 in which said gain mismatch detection circuit and said tuning circuit are coupled in feedback for measuring said gain mismatch and modifying said at least one parameter.

53. The system of claim 52 in which said at least one parameter includes one or more parameters chosen from the group consisting of: the gain of said second port modulation circuit, the gain of said phase lock loop circuit, the gain of said oscillator circuit, and the loop gain of said first modulation port.

54. A method for measuring the gain mismatch between modulation ports of a phase lock loop RF modulator system, the method comprising:
   detecting the phase error between an input reference signal and a feedback signal;
   providing an oscillating output signal;
   introducing modulation data to a first modulation port;
   introducing modulation data to a second modulation port; and
   measuring the gain mismatch between said first and second modulation ports by correlating said phase error with said modulation data.

55. The method of claim 54 further including the step of modifying at least one parameter associated with said first modulation port such that said gain mismatch is reduced.

56. The method of claim 55 in which said gain mismatch is reduced to a predetermined tolerance level and/or for a predetermined amount of time.

57. The method of claim 55 in which said at lest one parameter includes the gain of said first modulation port.

58. The method of claim 54 further including the step of modifying at least one parameter associated with said second modulation port such that said gain mismatch is reduced.

59. The method of claim 58 in which said gain mismatch is reduced to a predetermined tolerance level and/or for a predetermined amount of time.

60. The system of claim 59 in which said at least one parameter includes one or more parameters chosen from the group consisting of: the gain of a second port modulation circuit, the loop gain of said phase lock loop circuit, and the gain of said oscillator circuit.

61. The method of claim 60 further including the step of selectively disabling said second modulation port.

62. The method claim 61 further including the step of selectively providing a pre-emphasis filter coupled to said first modulation port.

63. The system of claim 54 further including the step of selectively disabling said second modulation port.

* * * * *